United States Patent
Tsunai

(10) Patent No.: US 11,012,604 B2
(45) Date of Patent: May 18, 2021

(54) IMAGE-CAPTURING DEVICE AND ELECTRONIC CAMERA

(71) Applicant: NIKON CORPORATION, Tokyo (JP)

(72) Inventor: Shiro Tsunai, Kawasaki (JP)

(73) Assignee: NIKON CORPORATION, Tokyo (JP)

( * ) Notice: Subject to any disclaimer, the term of this patent is extended or adjusted under 35 U.S.C. 154(b) by 0 days.

(21) Appl. No.: 16/068,038

(22) PCT Filed: Jan. 5, 2017

(86) PCT No.: PCT/JP2017/000144
§ 371 (c)(1),
(2) Date: Feb. 7, 2019

(87) PCT Pub. No.: WO2017/119447
PCT Pub. Date: Jul. 13, 2017

(65) Prior Publication Data
US 2019/0222741 A1 Jul. 18, 2019

(30) Foreign Application Priority Data
Jan. 8, 2016 (JP) .............................. JP2016-002731

(51) Int. Cl.
*H04N 5/232* (2006.01)
*H01L 27/146* (2006.01)
(Continued)

(52) U.S. Cl.
CPC ....... *H04N 5/23212* (2013.01); *H01L 27/146* (2013.01); *H01L 27/14627* (2013.01);
(Continued)

(58) Field of Classification Search
CPC . H01L 27/146–14893; H01L 27/14621; H01L 27/14643–14663; H01L 27/14627; G02B 7/34–346; H04N 2209/045–046
(Continued)

(56) References Cited

U.S. PATENT DOCUMENTS

2009/0294633 A1    12/2009  Seol et al.
2010/0026865 A1*   2/2010   Tivarus ............ H01L 27/14647
                                                     348/308

(Continued)

FOREIGN PATENT DOCUMENTS

CN    101593763 A    12/2009
JP    2013-145292 A   7/2013
JP    2015-162562 A   9/2015

OTHER PUBLICATIONS

Mar. 14, 2017 International Search Report issued in International Patent Application No. PCT/JP2017/000144.
(Continued)

*Primary Examiner* — Xi Wang
(74) *Attorney, Agent, or Firm* — Oliff PLC

(57) ABSTRACT

An image-capturing device includes: a plurality of pixels, having a plurality of first electrodes provided upon one surface of a light reception unit that receives incident light, and a plurality of second electrodes provided upon another surface of the light reception unit; and an output unit that outputs a signal generated by the light reception unit upon receipt of the incident light, the light reception unit being sandwiched between the first electrodes, to which a voltage is applied, and the second electrodes.

10 Claims, 11 Drawing Sheets

(51) Int. Cl.
*H04N 5/3745* (2011.01)
*H04N 5/369* (2011.01)
*H01L 27/30* (2006.01)

(52) U.S. Cl.
CPC .. *H01L 27/14634* (2013.01); *H01L 27/14667* (2013.01); *H01L 27/307* (2013.01); *H04N 5/369* (2013.01); *H04N 5/3745* (2013.01)

(58) Field of Classification Search
USPC .............. 250/208.1; 257/225–234, 257, 258, 257/291–294, 431–448; 348/273–283, 348/293; 396/79–83, 89–152; 356/3.13
See application file for complete search history.

(56) References Cited

U.S. PATENT DOCUMENTS

| 2011/0025904 A1* | 2/2011 | Onuki ................... G02B 7/346 |
| | | 348/360 |
| 2013/0182173 A1 | 7/2013 | Murata |
| 2015/0311259 A1* | 10/2015 | Joei ...................... H01L 27/307 |
| | | 250/208.1 |
| 2017/0104020 A1* | 4/2017 | Lee ..................... H01L 27/1463 |

OTHER PUBLICATIONS

Levin et al. "Image and Depth from a Conventional Camera with a Coded Aperture." ACM Transactions on Graphics, Jul. 2007, vol. 26, No. 3, Article 70.
Mar. 31, 2020 Office Action issued in Chinese Patent Application No. 201780014680.4.

* cited by examiner (b)

(c)

(a)

(b)

(c)

(a)

(b)

IMAGE-CAPTURING DEVICE AND ELECTRONIC CAMERA

TECHNICAL FIELD

The present invention relates to an image-capturing device and to an electronic camera.

BACKGROUND ART

A technique is per se known for obtaining a high resolution image or a refocused image by acquiring a plurality of digital images while changing over a plurality of masks having complicated aperture shapes set in a part of the lens optical system (for example, refer to Non-Patent Document #1). However there is the problem that this technique involves complicated operation for changing over the plurality of masks and performing image-capturing a plurality of times.

CITATION LIST

Non-Patent Literature

Non-Patent Document #1: A. Levin, R. Fergus, F. Durand and W. Freeman, "Image and Depth from a Conventional Camera with a Coded Aperture", SIGGRAPH 2007.

SUMMARY OF INVENTION

According to the 1st aspect, an image-capturing device comprises: a plurality of pixels, having a plurality of first electrodes provided upon one surface of a light reception unit that receives incident light, and a plurality of second electrodes provided upon another surface of the light reception unit; and an output unit that outputs a signal generated by the light reception unit upon receipt of the incident light, the light reception unit being sandwiched between the first electrodes, to which a voltage is applied, and the second electrodes.

According to the 2nd aspect, it is preferable that in the image-capturing device according to the 1st aspect, the plurality of first electrodes are provided for each of the pixels, along a first direction; and the plurality of second electrodes are provided for each of the pixels, along a second direction that intersects the first direction.

According to the 3rd aspect, the image-capturing device according to the 1st or 2nd aspect may comprise: a first image-capturing unit that has the plurality of pixels; a second image-capturing unit that receives light that has passed through the first image-capturing unit; and an image generation unit that generates image data for a plurality of different imaging planes based upon the signal from the first image-capturing unit.

According to the 4th aspect, it is preferable that in the image-capturing device according to the 3rd aspect, the output unit sets combinations each consisting of at least a single first electrode from among the plurality of first electrodes and at least a single second electrode from among the plurality of second electrodes, and, for each of a plurality of different combinations that have been set, outputs a signal generated by the light reception unit according to the combination; and the image generation unit generates image data for the plurality of different imaging planes by using the signals outputted for each of the combinations.

According to the 5th aspect, it is preferable that in the image-capturing device according to the 4th aspect, the output unit sets the combinations by performing specification or non-specification of each of the plurality of second electrodes, each time voltages are sequentially applied to each of the plurality of first electrodes; and the output unit outputs the signal generated by the light reception unit that is sandwiched between the first electrode to which the voltage has been applied and the second electrode that has been specified, each time a voltage is sequentially applied to one of the first electrodes.

According to the 6th aspect, it is preferable that in the image-capturing device according to any one of the 3rd through 5th aspects, the image generation unit generates image data having a single imaging plane based upon a signal from the second image-capturing unit.

According to the 7th aspect, the image-capturing device according to the 6th aspect may comprise a focus detection unit that detects a focus adjustment state of a photographic optical system by using the image data generated based upon the signal from the first image-capturing unit and the image data generated based upon the signal from the second image-capturing unit.

According to the 8th aspect, an electronic camera comprises an image-capturing device according to any one of the 1st through 7th aspects.

DESCRIPTION OF EMBODIMENTS

Embodiment #1

Figure 1:
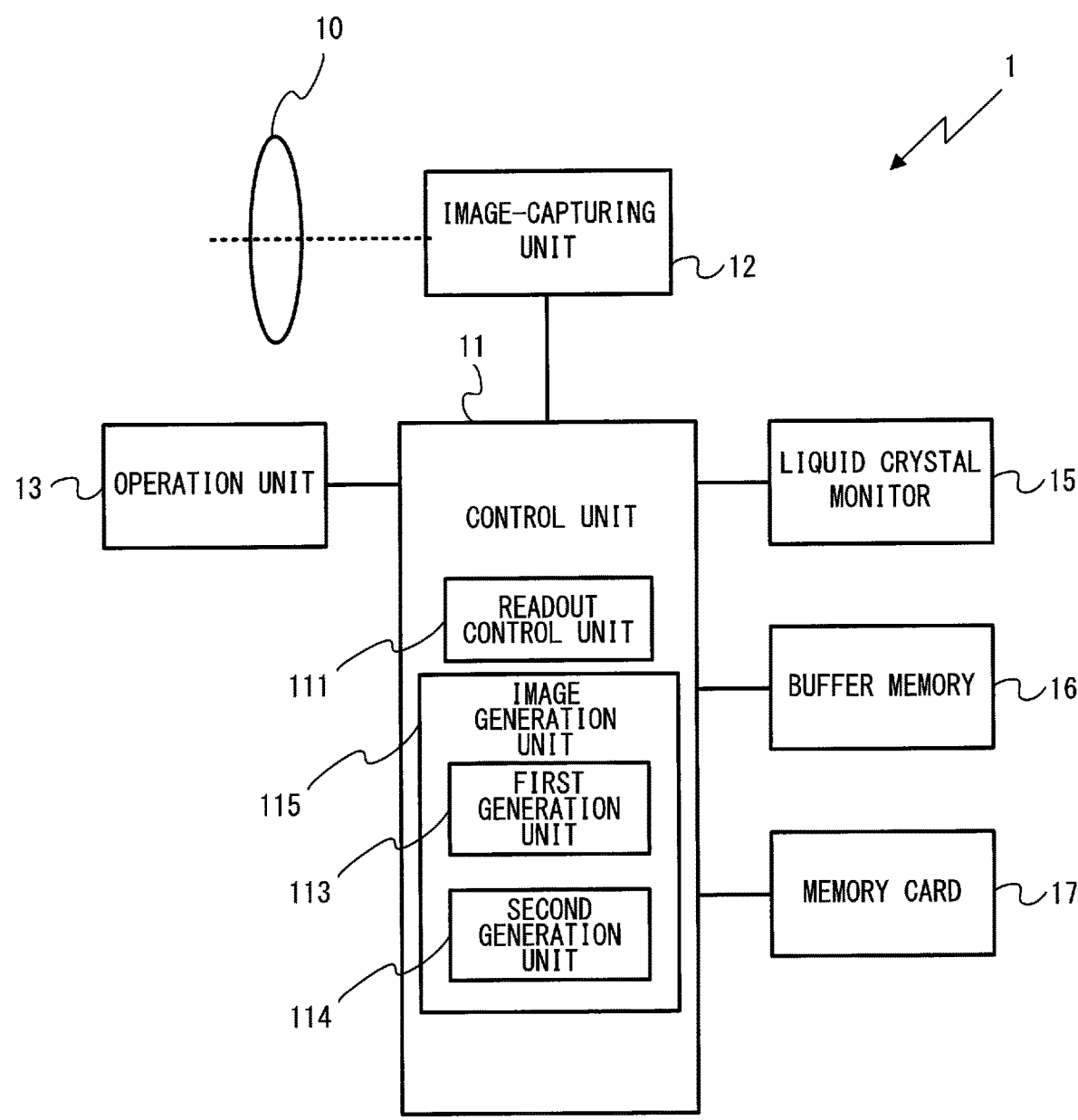
FIG. 1 is a block diagram for explanation of an example of the structure of a digital camera according to a first embodiment.

FIG. 1 is a block diagram showing an example of the structure of principal portions of a digital camera 1 that is an example of an image-capturing device according to the first embodiment. This digital camera 1 comprises a photographic optical system 10, a control unit 11, an image-capturing unit 12, an operation unit 13, a liquid crystal monitor 15, and a buffer memory 16. Moreover, a memory card 17 is installed to the digital camera 1.

The photographic optical system 10 comprises a plurality of lenses, and focuses an image of a photographic subject upon an image-capturing surface of the image-capturing unit 12. It should be understood that in FIG. 1, for the convenience of illustration, one lens is shown as representative of the photographic optical system 10.

The control unit 11 comprises a microprocessor and peripheral circuitry thereof, and performs various types of control of the digital camera 1 by executing a control program stored in a ROM not shown in the figures. Moreover, as functional components, the control unit 11 includes a readout control unit 111 and an image generation unit 115. The readout control unit 111 controls readout of a signal from a first imaging element 31 (which is a photoelectrically converted signal) and of a signal from a second imaging element 32 (which is also a photoelectrically converted signal), both of which will be described hereinafter. The image generation unit 115 generates image data by applying image processing of various kinds upon the photoelectrically converted signals that have been read out by the readout control unit 111 from the first imaging element 31 and from the second imaging element 32. In the following, the image generation unit 115 will be explained as having the functions of a first generation unit 113 and a second generation unit 114. The first generation unit 113 generates image data by performing image processing of various kinds upon the photoelectrically converted signals read out from the first imaging element 31. And the second generation unit 114 generates image data by performing image processing of various kinds upon the photoelectrically converted signals read out from the second imaging element 32. These functional elements are implemented in software by the control program described above. It should be understood that it would also be possible to construct these functional units using electronic circuitry.

An image of the photographic subject that has been focused upon the image-capturing unit 12 by the photographic optical system 10 is photoelectrically converted by the image-capturing unit 12. The output signal from the image-capturing unit 12 is converted into a digital image signal by an A/D conversion unit not shown in the figures, and is stored in the buffer memory 16. After image processing of various kinds has been performed upon this digital image signal stored in the buffer memory 16, it may be displayed upon the liquid crystal monitor 15, or may be stored upon the memory card 17. The memory card 17 comprises a non-volatile flash memory or the like, and is detachable from the digital camera 1. And the operation unit 13 comprises operation buttons of various types, such as a release button, a mode changeover button, a power supply button, and so on, and is operated by the photographer. The operation unit 13 outputs operation signals to the control section 11 according to operation by the photographer of the operation buttons described above.

Explanation of the Image-Capturing Unit 12

FIG. 2(a) is a figure showing an example of the relationship between a partial cross section of the image-capturing unit 12 and the photographic optical system 10, and FIG. 2(b) is a figure showing an enlarged cross section of an example of the image-capturing unit 12 shown in FIG. 2(a). This image-capturing unit 12 comprises a second imaging element 32 that is formed upon a semiconductor substrate, a first imaging element 31 that utilizes an organic photoelectric film 310, and a number of micro-lenses ML. The first imaging element 31 and the second imaging element 32 are stacked upon the same optical path. A micro-lens array in which the plurality of micro-lenses ML are arranged in a two dimensional configuration is stacked upon the incident light side of the first imaging element 31, in other words upon the side opposite to the second imaging element 32, with a flattening layer sandwiched between them. The first imaging element 31 is arranged with respect to the micro lenses ML so as to have a conjugate relationship with the exit pupil of the photographic optical system. And the first imaging element 31 comprises an organic photoelectric layer 310 that absorbs (i.e. photoelectrically converts) light of a predetermined color component (this will be described in detail hereinafter).

Figure 2:
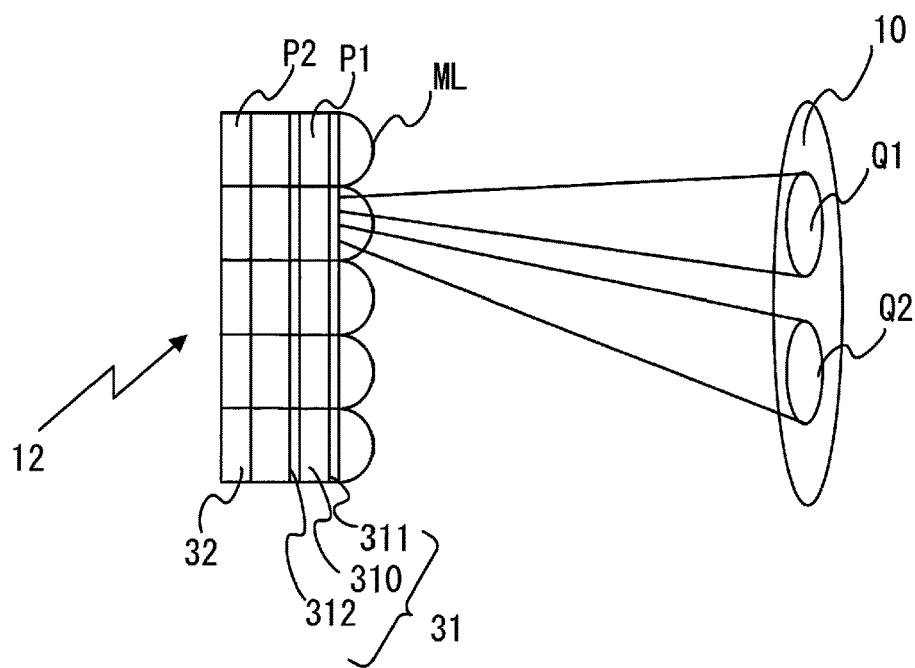
FIG. 2 is a figure for explanation of a summary of an image-capturing unit.
Figure 2:
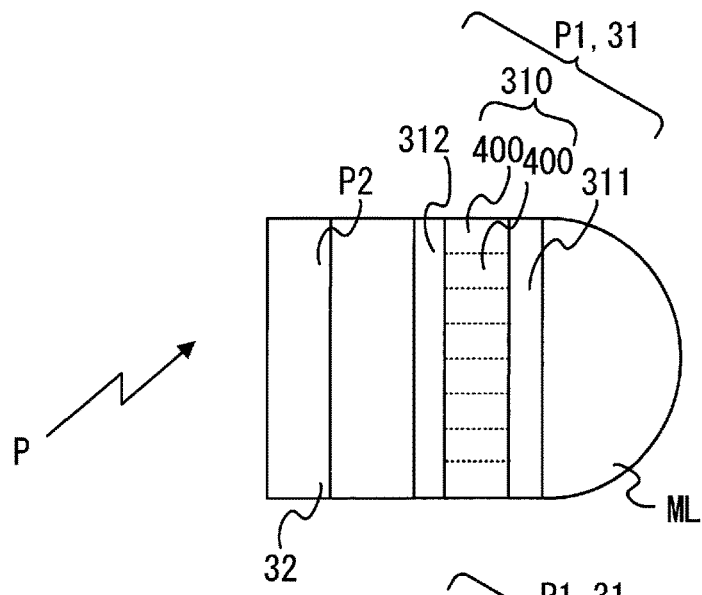
Figure 2:
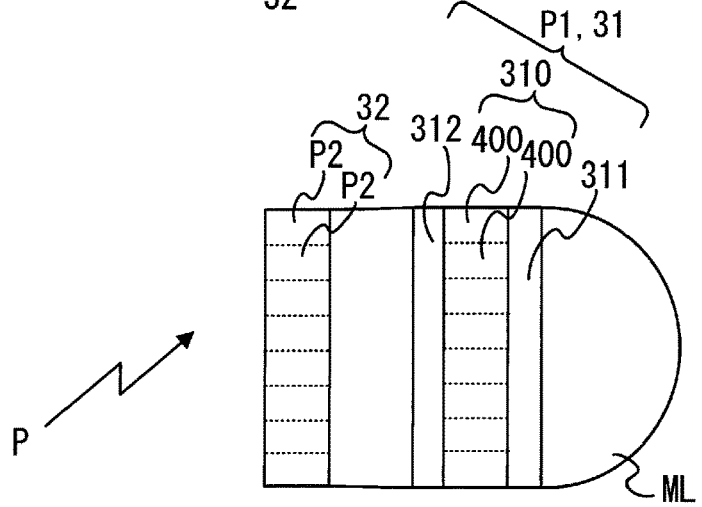
Figure 3:
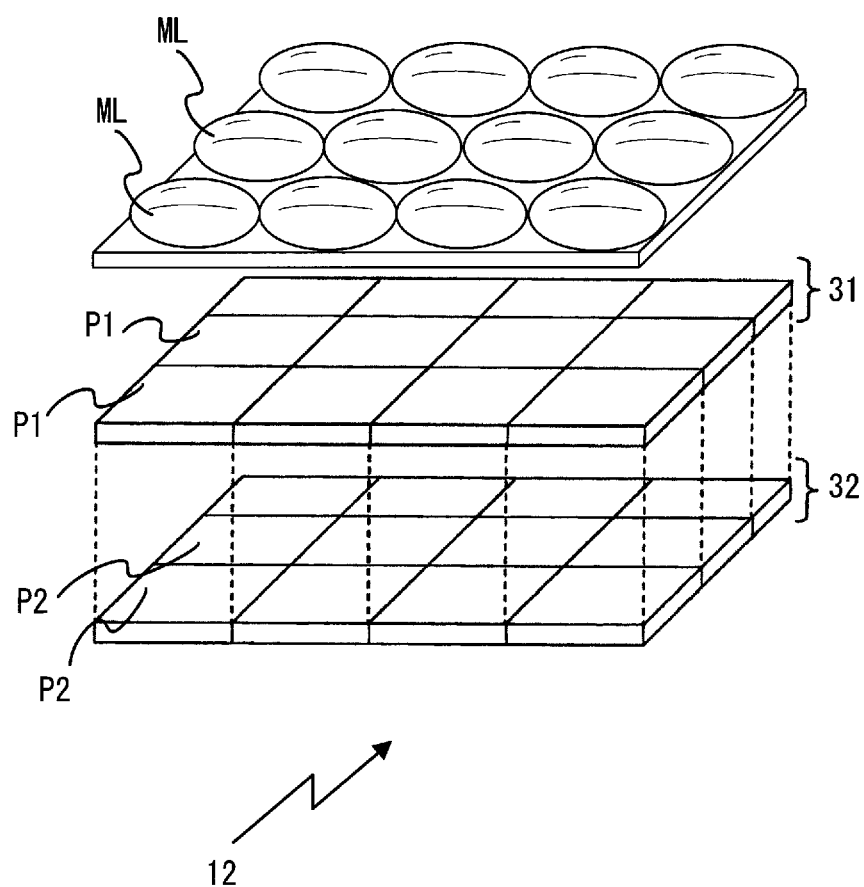
FIG. 3 is a figure showing an example of a cross section of a portion of the image-capturing unit.

FIG. 3 is a perspective view showing an outline of an example of the image-capturing unit 12. It should be understood that FIG. 3 is a figure showing an example of a portion of the image-capturing unit 12, and, for convenience of illustration, the micro-lens array and the first imaging element 31 are shown in a state in which they are separated along the direction of the optical path. The first imaging element 31 includes a plurality of first pixels P1 that are arranged in a two dimensional configuration, and each of these first pixels P1 and one of the micro-lenses ML are provided in corresponding positions, in other words are provided upon the same optical path. And the second imaging element 32 is a photodiode (i.e. a semiconductor element) that is made from silicon or the like. The second imaging element 32 includes a plurality of second pixels P2 that are arranged in a two dimensional configuration, and each of these second pixels P2 and one of the micro-lenses ML are provided in corresponding positions, in other words upon the same optical path. Accordingly, as also shown in FIG. 2, for each of the micro-lenses ML, a first pixel P1 of the first imaging element 31 and a second pixel P2 of the second imaging element 32 are provided upon the same optical path. Due to this, light that has passed through the micro-lens ML is partially absorbed by the first pixel P1 of the first optical element 31 that is disposed upon that same optical path. However, some of the light is not absorbed by that first pixel P1, and passes through the first imaging element 31, is then incident upon the second pixel P2 of the second imaging element 32 that is disposed upon the same optical path as the first pixel P1, and is then photoelectrically converted by the second imaging element 32.

As shown in FIG. 2, for each of the first pixels P1, a plurality of first electrodes 311 are arranged on the light incident side of the organic photoelectric film 310, in other words on its side that faces toward the corresponding micro-lens ML, and a plurality of second electrodes 312 are arranged on the light emission side of the organic photoelectric film 310, in other words on its side that faces toward the second imaging element 32. In other words, the first imaging element 31 is built up by disposing the first electrodes 311 and the second electrodes 312 on opposite sides of the organic photoelectric film 310. The first electrodes 311 and the second electrodes 312 are transparent electrodes. The first electrodes 311 and the second electrodes 312 extend in mutually different directions. In this embodiment, the first electrodes 311 and the second electrodes 312 are mutually orthogonal. It should be understood that the details of the first electrodes 311 and the second electrodes 312 will be explained hereinafter.

In this embodiment, as will be described in detail hereinafter, a single light reception portion 400 includes a single one of the first electrodes 311, a single one of the second electrodes 312, and an organic photoelectric film 310 that is sandwiched between this single first electrode 311 and this single second electrode 312. Since a single first pixel P1 comprises a plurality of the first electrodes 311 and a plurality of the second electrodes 312, accordingly a plurality of these light reception units 400 are arranged in a two dimensional configuration over a single one of the first pixels P1. Due to this, in each of the first pixels P1, light fluxes that have passed through different partial regions Q1 and Q2 of the exit pupil of the photographic optical system 10 can be received via the micro lefts ML by the plurality of light reception units 400 (refer to FIGS. 2(a) and 4(a)). As an example, the light flux that has passed through the partial region Q1 of the photographic optical system 10 (refer to FIG. 2(a)) is received by a light reception unit 400a (refer to FIG. 4(a)), while the light flux that has passed through the partial region Q2 of the photographic optical system 10 (refer to FIG. 2(a)) is received by a light reception unit 400b (refer to FIG. 4(a)).

It should be understood that the present invention is not limited to the case in which a single second pixel P2 is provided for a single micro-lens ML; a plurality of second pixels P2 could also be provided for each micro-lens. For example, as shown in enlarged view in FIG. 2(c) which is a partial cross section of the image-capturing unit 12, it will be acceptable for each of the second pixels P2 to be provided at a position that corresponds to one of the light reception units 400 of the first imaging element 31, in other words upon the optical path of its light from the photographic subject. It should be understood that each of the second pixels P2 need not necessarily be disposed at a position that corresponds to a single light reception unit 400 of the first imaging element 31; it would also be acceptable to implement a configuration in which each of the plurality of second pixels P2 is arranged so as to receive light that has passed through a predetermined plural number of the light reception units 400.

In this embodiment, as will be described in detail hereinafter, it is possible to obtain parallax information that is required for refocusing processing such as repairing blurring or generating an image in which the focus is adjusted to a specific position or the like, by specifying certain ones of the light reception units 400, among the plurality of the light reception units 400 of the first pixel P1, for outputting photoelectrically converted signals. In other words, image data that would be obtained by inserting a per se known coded aperture at the exit pupil position of the photographic optical system can be acquired by electrically specifying the light reception units 400 for outputting the corresponding photoelectrically converted signals by specifying their first electrodes 311 and second electrodes 312.

The light from the photographic subject that is incident upon the image-capturing unit 12 passes through the transparent first electrodes 311 of the first imaging element 31 and is partially photoelectrically converted by the organic photoelectric layer 310. In other words, all of the light reception units 400 included in the first pixel P1 receive incident light from the photographic subject and perform photoelectric conversion. The photoelectrically converted signal generated by photoelectric conversion by the light reception unit 400, among the light reception units 400 of the first pixel P1, that is sandwiched between a first electrode 311 and a second electrode 312, both of which have been specified as will be described hereinafter, is outputted to signal output terminals via a wiring layer. On the other hand, the light that has not been photoelectrically converted by the first imaging element 31 passes through the first imaging element 31 and is incident upon the second imaging element 32. The second imaging element 32 photoelectrically converts the light that is incident upon the surface side of its semiconductor substrate with photodiodes, and outputs the resulting photoelectrically converted signals via a wiring layer that is formed on the surface of the semiconductor substrate.

It should be understood that it may be arranged for the color component that is photoelectrically converted by the first imaging element 31 and the color component that is photoelectrically converted by the second imaging element 32 to be in a complementary color relationship. For example, the first pixel P1 may photoelectrically convert Mg (magenta) light, while light of the complementary color to Mg, i.e. G (green) light passes through the first pixel and with this G light being photoelectrically converted by the second pixel P2. Moreover, the first pixel P1 may photoelectrically convert Y (yellow) light, with light of the complementary color to Y, i.e. B (blue) light passing through the first pixel and with this B light being photoelectrically converted by the second pixel P2. And the first pixel P1 may photoelectrically convert Cy (cyan) light, with light of the complementary color to Cy, i.e. R (red) light passing through the first pixel and with this R light being photoelectrically converted by the second pixel P2.

In this case, first pixels P1 that photoelectrically convert Mg and Ye light are arranged alternatingly as the first pixels P1 in the odd numbered rows, and first pixels P1 that photoelectrically convert Cy and Mg light are arranged alternatingly as the first pixels P1 in the even numbered rows. Due to this, in this image-capturing unit 12, the first imaging elements 31 comprised in the organic photoelectric film 310 fulfill the role of color filters for the second imaging element 32, so that a complementary color image from that of the first imaging element 31 is received from the second imaging element 32. Accordingly, with this image-capturing unit 12, it is possible to acquire a CMY image composed of the three colors Cy, Mg, and Ye from the first imaging element 31, and also it is possible to acquire a RGB image composed of the three colors R, G, and B from the second imaging element 32.

It should be understood that the fact that the first imaging element 31 incorporates the organic photoelectric film 310 is not to be considered as being limitative; it would be possible to build that layer using another material that has the characteristic of absorbing light of a predetermined color component while passing light of another color component.

Figure 4:
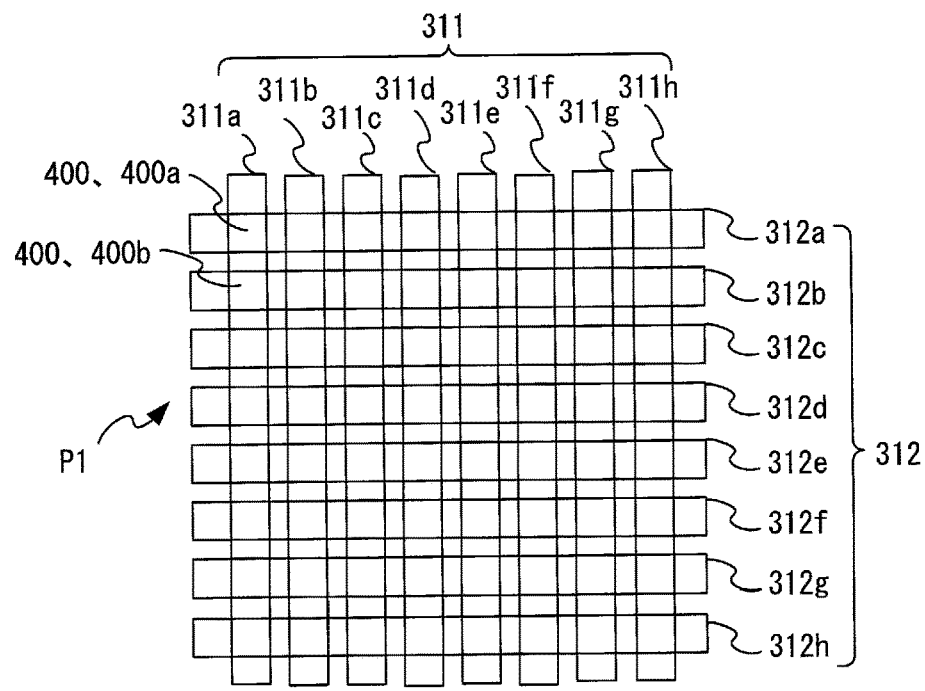
FIG. 4 is a figure schematically showing an example of the arrangement of first electrodes and second electrodes of a first imaging element.
Figure 4:
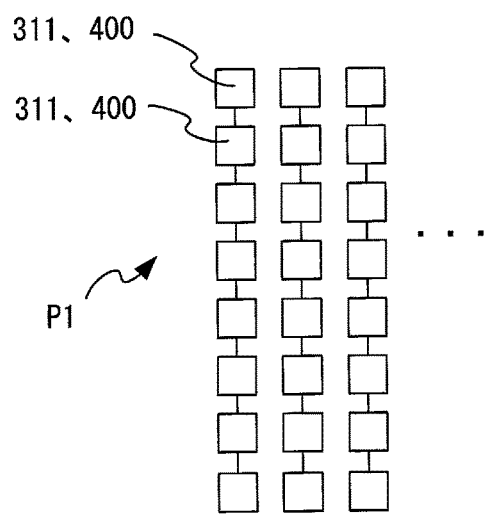
Figure 4:
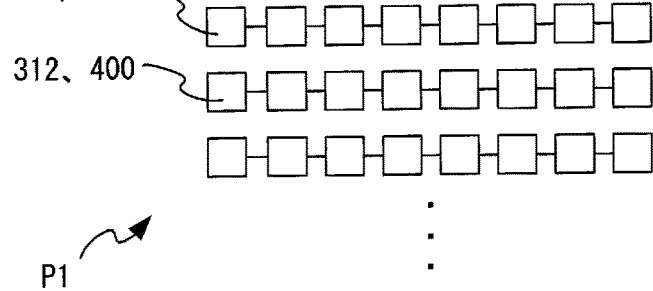

FIG. 4 is a plan view schematically showing the arrangement of the first electrodes 311 and the second electrodes 312 of a single first pixel P1. Moreover, in the following explanation, the left to right direction on the drawing paper in FIG. 4 will be termed the "row direction" while the up to down direction will be termed the "column direction".

As shown in FIG. 4(a), in this first pixel P1, a plurality of first electrodes 311a through 311h are arranged along the row direction, each of them extending along the column direction. Moreover, a plurality of second electrodes 312a through 312h are arranged along the column direction, each of them extending along the row direction. It should be understood that it would also be acceptable for each of the first electrodes 311 to extend along the row direction, while each of the second electrodes 312 extends along the column direction. Furthermore, the number of the first electrodes 311 and the number of the second electrodes 312 that are provided for the single first pixel P1 shown in FIG. 4 are only examples; it would also be acceptable to provide more thereof than shown in FIG. 4, or to provide fewer thereof.

At least a single first electrode 311 among the plurality of first electrodes 311 is specified according to an electrode specification signal from the readout control unit 111, and voltage is applied thereto. And at least a single second electrode 312 among the plurality of second electrodes 312 is specified according to another electrode specification signal from the readout control unit 111, and thereby a photoelectrically converted signal generated by a light reception unit 400 is read out. In other words, the photoelectrically converted signal that has been photoelectrically converted by the partial region of the organic photoelectric film 310 that is sandwiched by the first electrode 311 to which voltage is being supplied and the specified second electrode 312 is outputted from the second electrode 312. The readout control unit 111 functions as an output section that outputs this signal generated by that light reception unit 400 that is sandwiched between the first electrode 311 to which voltage is applied and the second electrode 312.

As described above, a single light reception unit 400 includes a single first electrode 311, a single second electrode 312, and that part of the organic photoelectric film 310 that is sandwiched between this single first electrode 311 and this single second electrode 312. To put it in another manner, the first electrode 311 is provided upon one surface of the light reception unit 400, while the second electrode 312 is provided upon the other surface of the light reception unit 400. Accordingly, the plurality of first pixels P1 include a plurality of first electrodes 311 that are provided upon the one surfaces of the light reception units 400, and a plurality of second electrodes 312 that are provided upon the other surfaces of the light reception units 400.

It should be understood that, in FIG. 4(a), the first electrodes 311 are all provided with members that are the same and that have the same width in the column direction. Furthermore, the second electrodes 312 are all provided with members that are the same and that have the same width in the row direction. However, this example is not to be considered as being limitative of the present invention; for example, as shown in FIG. 4(b), it would also be acceptable to connect a plurality of first electrodes 311 that are provided to a plurality of light reception units 400 arranged in the column direction, with members that are different from the first electrodes 311 and of different width. Similarly, as shown in FIG. 4(c), it would also be acceptable to connect a plurality of second electrodes 312 that are provided to a plurality of light reception units 400 arranged in the row direction, with members that are different from the second electrodes 312 and of different width.

Moreover, in the example shown in FIG. 4(a), a case is shown in which the lengths in the row direction (i.e. the widths) of the first electrodes 311a through 311h are all equal to one another, but the present invention is not to be considered as being limited by this example; a case in which the lengths in the row direction (i.e. the widths) of the first electrodes 311a through 311h are mutually different is also to be considered as being included. To put it in another manner, among all the first electrodes 311, it would be acceptable for the width of at least a single one of the first electrodes 311 to be different from the widths of the other first electrodes 311; and it would also be acceptable for all of the first electrodes 311 to have mutually different widths. In a similar manner, the case in which the widths in the column direction of the second electrodes 312a through 312h are different from one another is also to be considered as being included in the scope of the present invention.

Furthermore, an organic photoelectric film 310 may be provided for each of the first pixels P1; or an organic photoelectric film 310 may be provided for each of the light reception units 400. If the color component that is photoelectrically converted by the first imaging element 31 and the color component that is photoelectrically converted by the second imaging element 32 are not in a relationship of being complementary colors, then it would also be acceptable to provide an organic photoelectric film 310 that consists of the same material to all of the first pixels P1.

Figure 5:
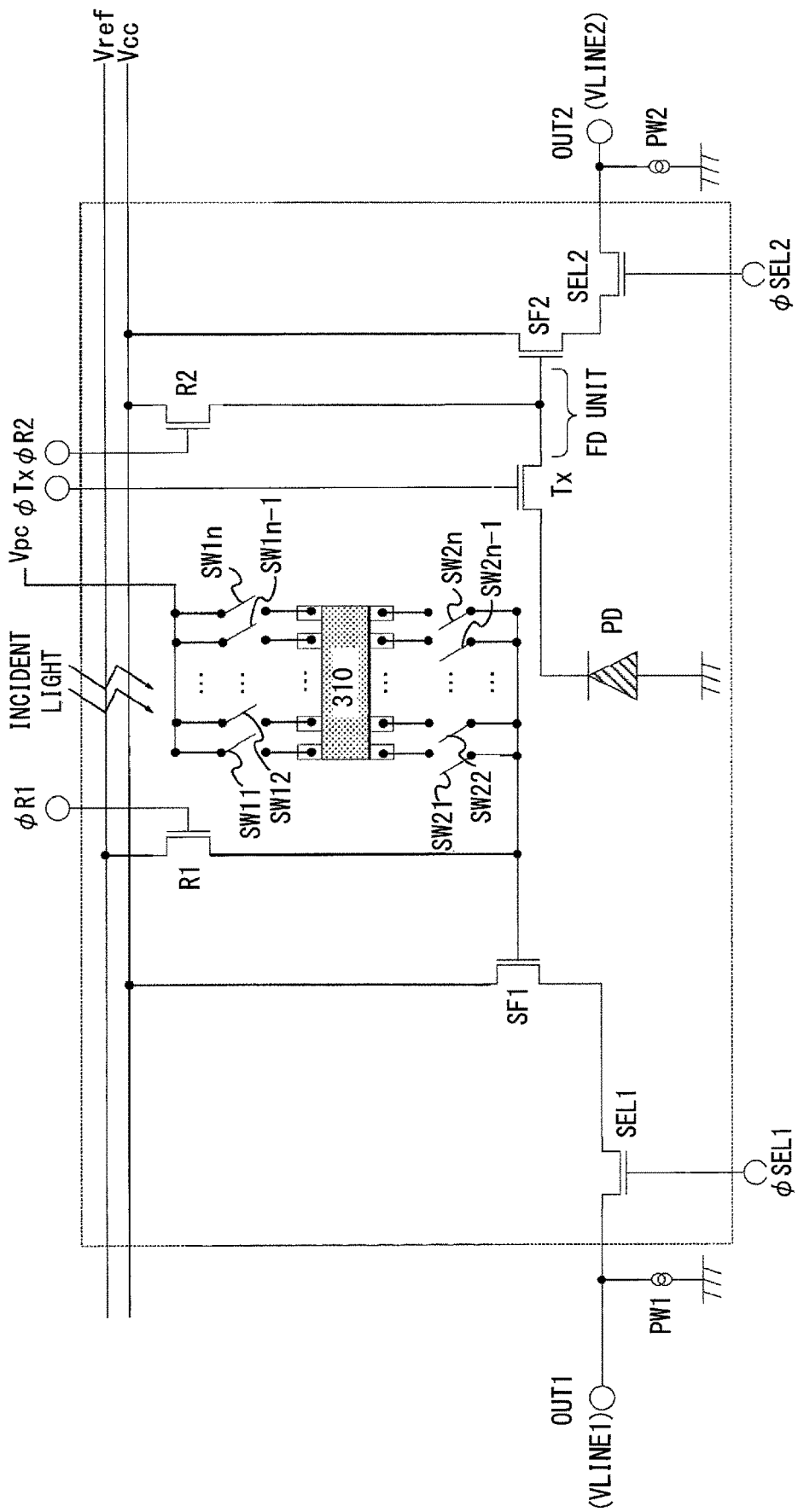
FIG. 5 is a figure showing an example of a circuit structure of one pixel in the image-capturing unit.

FIG. 5 is a figure showing an example of the circuit structure of a single first pixel P1 and a single second pixel P2 in this image-capturing unit 12. The second pixel P2 includes a photodiode PD, a transfer transistor Tx, a reset transistor R2, an output transistor SF2, and a selection transistor SEL2. The photodiode PD accumulates charge according to the amount of light incident thereupon. The transfer transistor Tx transfers the charge accumulated by the photodiode PD to a floating diffusion region (i.e. an FD portion) on the output transistor SF2 side. The output transistor SF2 forms a source follower with a current source PW2 via the selection transistor SEL2, and outputs a signal corresponding to the charge accumulated in the FD unit to a vertical signal live VLINE2 as an output signal OUT2. It should be understood that the reset transistor R2 resets the charge of the FD unit to the power supply voltage Vcc.

Furthermore, the first pixel P1 includes an organic photoelectric film 310, a reset transistor R1, an output transistor SF1, a selection transistor SEL1, specification switches SW11 through SW1$n$, and specification switches SW21 through SW2$n$ (where n is a natural number greater than or equal to 2). The specification switches SW11 through SW1$n$ are provided to correspond to the first electrodes 311a through 311h respectively, and one of them is turned ON according to the electrode specification signal from the readout control unit 111. And the specification switches SW21 through SW2$n$ are provided to correspond to the second electrodes 312a through 312h respectively, and one of them is turned ON according to the electrode specification signal from the readout control unit 111. The organic photoelectric film 310 converts the non-transmitted light into an electrical signal that corresponds to the amount of light, and outputs this signal as an output signal OUT1 to a vertical signal line VLINE1 via the output transistor SF1, which forms a source follower with a current source PW1 via the selection transistor SEL1. It should be understood that the reset transistor R1 resets the output signal of the organic photoelectric film 310 to the reference voltage Vref. Moreover, a high voltage Vpc is provided for operation of the organic photoelectric film 310. Each of the transistors consists of a MOSFET.

It should be understood that the power supply voltage Vcc and the reference voltage Vref may be the same. In other words, it will be acceptable for the reset transistor R1 and the output transistor SF1 to be operated at the same voltage.

The operation of this circuitry related to the second imaging element 32 will now be explained. First, when the selection signal φSEL2 is set to "high", the selection transistor SEL2 is set to ON. Next, when the reset signal φR2 is set to "high", the transistor is reset to the power supply voltage Vcc by the FD unit, and its output signal OUT2 is also set to the reset level. And, after the reset signal φR2 has been set to "low", the transfer signal φTx is set to "high", the charge accumulated by the photodiode PD is transferred to the FD unit, and an output signal OUT2 corresponding to the amount of charge is outputted from the vertical signal line VLINE2. The output signal OUT2 of each of the second pixels P2 read out to the vertical signal line VLINE2 is outputted from the image-capturing unit 12, after having been temporarily stored in a horizontal output circuit for each row (not shown in the figures). The signal from each of the second pixels P2 of the second imaging element 32 of the image-capturing unit 12 is read out in this manner.

The operation of this circuitry related to the first imaging element 31 will now be explained. First, when the selection signal φSEL1 is set to "high", the selection transistor SEL1 is set to ON. Next, when the reset signal φR1 is set to "high", the output signal OUT1 is also set to the reset level. And, directly after the reset signal φR1 has been set to "low", charge accumulation by the organic photoelectric film 310 is started, and the output signal OUT1 changes corresponding to the amount of charge. After having been temporarily stored in a horizontal output circuit for each row (not shown in the figures), the output signal OUT1 is outputted. The signal from each of the first pixels P1 of the first imaging element 31 of the image-capturing unit 12 is read out in this manner.

By having a circuit structure as described above, it is possible for photoelectrically converted signals to be outputted by the first imaging element 31 of the image-capturing unit 12 from the light reception units 400 that are included in any desired partial area.

Figure 6:
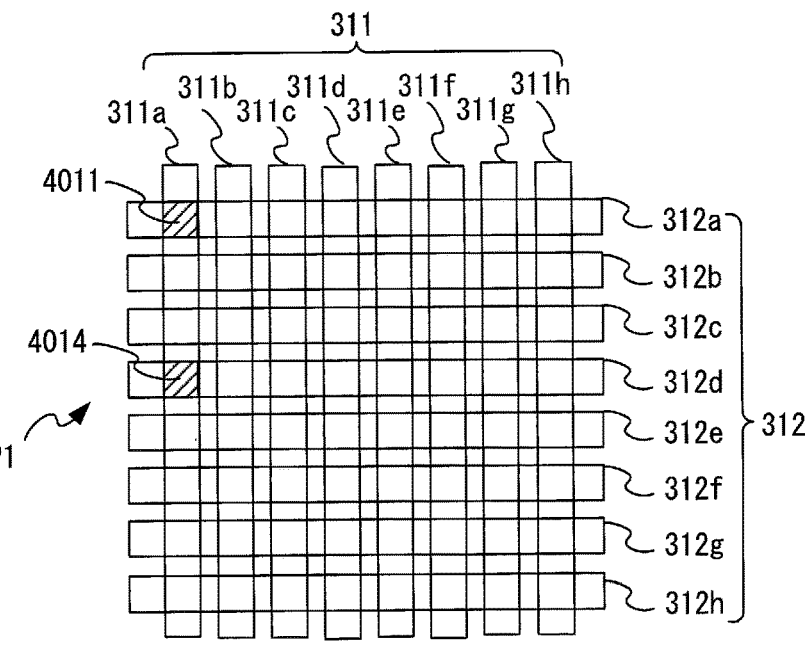
FIG. 6 is a figure for explanation of a relationship, in the first imaging element, between specified first electrodes and specified second electrodes and a light-receiving unit that outputs a photoelectrically converted signal.
Figure 6:
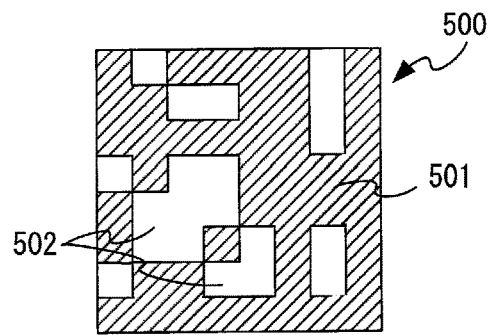
Figure 6:
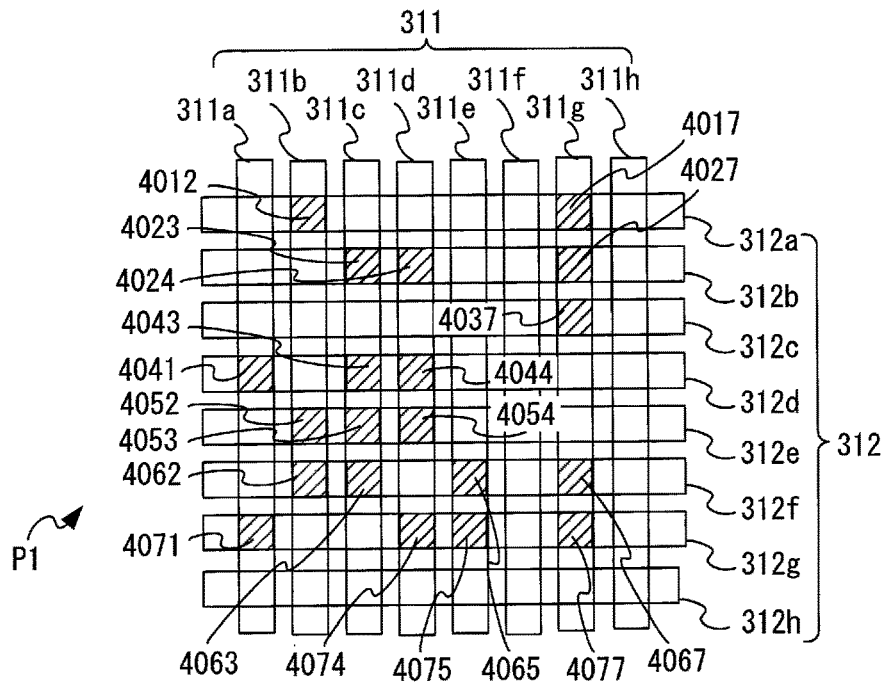

With reference to FIG. 6, an explanation will now be given of a light reception unit 400 in which photoelectrically converted signals are outputted from a specified first electrode 311 and a specified second electrode 312. If for example, a first electrode 311a and a second electrode 312a are specified by the circuitry shown in FIG. 5(a), then the light reception unit 4011 is selected, and the photoelectrically converted signal that has been photoelectrically converted by this light reception unit 4011 is outputted. Furthermore, if the first electrode 311a and the second electrodes 312a and 312d are specified, then the light reception units 4011 and 4014 are selected, and the photoelectrically converted signals that have been photoelectrically converted by these light reception units 4011 and 4012 are outputted.

In this embodiment, it is possible to obtain the parallax information that is necessary for performing refocusing processing such as repairing blurring or generating an image in which the focus is adjusted to a specific position or the like, according to the combinations of the first electrodes 311 and the second electrodes 312 that are specified. In other words, image data that would be obtained by inserting a per se known coded aperture at the exit pupil position of the photographic optical system can be acquired by electrically specifying the light reception units 400 that are to output the corresponding photoelectrically converted signals as specified by the first electrodes 311 and the second electrodes 312. For example, in the case of a per se known coded aperture 500 of the type shown in FIG. 6(b), it is possible, with the first electrodes 311 and the second electrodes 312, to recreate a photoelectrically converted signal corresponding to light that would have passed through a coded aperture having a two dimensional configuration temporarily inserted at the position of the exit pupil of the photographic optical system. It should be understood that, in the coded aperture 500 of FIG. 6(b), the regions 501 shown by diagonal hatching are light interception portions, while the regions 502 where there is no hatching are light transmission portions. In order to recreate the coded aperture 500 shown in FIG. 6(b), as shown in FIG. 6(c), upon the first imaging element 31, the first electrodes 311 and the second electrodes 312 for the light reception units 400 that correspond to the regions 502 are specified, and voltage is applied to those first electrodes 311, so that the photoelectrically converted signals that have been photoelectrically converted are outputted. It should be understood that, in FIG. 6(c), for the convenience of illustration, the light reception units 4012, 4017, 4023, 4024, 4027, 4037, 4041. 4043, 4044, 4052, 4053, 4054, 4062, 4063, 4065, 4067, 4071, 4074, 4075 and 4077 that correspond to the regions 502 are shown by diagonal hatching. In this case, photoelectrically converted signals are outputted from the light reception units 400 by first electrodes 311 and second electrodes 312 being specified as will now be described, and by voltages being applied to those first electrodes 311.

First, for the second electrode 312a, the first electrodes 311b and 311g are specified, and, among the photoelectrically converted signals that have been generated by photoelectric conversion by all of the light reception units 400, the photoelectrically converted signals that have been photoelectrically converted by the light reception units 4012 and 4017 are outputted. Next, for the second electrode 312b, the first electrodes 311c, 311d, and 311g are specified and voltage is applied to them, and the photoelectrically converted signals that have been photoelectrically converted by the light reception units 4023, 4024, and 4027 are outputted. And subsequently, each time a second electrode 312 that extends in the row direction is specified, the first electrodes 311 that correspond to the corresponding positions in the regions 502 and extend in the column direction are specified, voltage is applied to them, and the photoelectrically converted signals that have been photoelectrically converted by the corresponding light reception units 400 are outputted. To put this in another manner, combinations are set corresponding to the regions 502 by, each time one of the second electrodes 312 is specified, specification (in other words, application of voltage) or non-specification (in other words, non-application of voltage) being performed for each of the first electrodes 311. A photoelectrically converted signal is outputted from each of the specified light reception units 400 that has a first electrode 311 to Which voltage is applied and a second electrode 312 that has been specified. Due to this, for each of the first pixels P1, according to the combinations of the first electrodes 311 and second electrodes 312 that are specified, it is possible to output photoelectrically converted signals corresponding to the light incident upon any desired light reception units 400 of the first imaging element.

Since, as described above, with respect to the micro-lens ML, the first imaging element has a conjugate relationship with the exit pupil of the photographic optical system 10, accordingly the photoelectrically converted signal that is outputted from the first pixels P1 of the first imaging element 31 according to the combination of the first electrodes 311 and the second electrodes 312 includes parallax information at the exit pupil position. In other words, by establishing various different combinations of first electrodes 311 and second electrodes 312, without actually inserting any coded aperture, it is possible to obtain photoelectrically converted signals that include parallax information that is equivalent to the information that would be present in photoelectrically converted signals obtained by inserting a plurality of various different coded apertures at the position of the exit pupil.

It should be understood that, as described above, the light that is not absorbed by the first pixels P1 of the first imaging element 31 is transmitted through them. Accordingly, irrespective of whether or not first electrodes 311 and/or second electrodes 312 are specified, the light that is not absorbed by the organic photoelectric film 310 and is therefore not photoelectrically converted thereby passes through the organic photoelectric film 310 and is incident upon the second imaging element 32.

In the processing described above, during photographic operation, the readout control unit 111 performs control by setting combinations of the first electrodes 311 and the second electrodes 312 so as to output photoelectrically converted signals from the light reception units 400 that are included in the partial region of the first imaging element 31. By making the combinations of the first electrodes 311 and the second electrodes 312 different, and by synthesizing image data generated for each of these different combinations, it is possible to obtain equivalent operation to the case when imaging, upon the light reception surface of the first imaging element 31, point images incident from different positions of the photographic subject space in the depth direction.

In this case, information (hereinafter termed "pattern information") related to combinations of first electrodes 311 and second electrodes 312 that correspond to coded apertures 500 such as the one shown in FIG. 6(*b*) is stored in advance in a predetermined storage region. Pattern information of a plurality of types is prepared, corresponding to the shapes of a plurality of code apertures. When the photographic operation starts, the readout control unit 111 sets a combination of the first electrodes 311 and the second electrodes 312 according to the information for a single pattern that has been read out from among the plurality of sets of pattern information, and outputs an electrode specification signal. For example, if the pattern information corresponds to FIG. 6(*b*), then the readout control unit 111 outputs an electrode specification signal, such that photoelectrically converted signals are outputted from the light reception units 400 shown by the hatched lines in FIG. 6(*c*). Accordingly, for each of the first pixels P1 of the first imaging element 31, a photoelectrically converted signal is obtained corresponding to the light incident upon the light reception units 400 included in the region corresponding to the region 502 of FIG. 6(*b*). The first generation unit 113 generates image data for an image upon a predetermined imaging plane of the photographic optical system 10 using this photoelectrically converted signal.

Subsequently, in a similar manner, the readout control unit 111 sets a combination of the first electrodes 311 and the second electrodes 312 for each different set of pattern information, and causes corresponding photoelectrically converted signals to be read out from the first imaging element 31. And the first generation unit 113 generates image data for images upon each of the different imaging planes of the photographic optical system 10 by generating image data for each of these photoelectrically converted signals that corresponds to each different combination of the first electrodes 311 and the second electrodes 312. The first generation unit 113 generates image data that is capable of being utilized for refocusing processing by synthesizing the image data generated for these images upon each of the different imaging planes, and stores this image data upon a storage medium such as the memory card 17 or the like.

During the photographic operation, for each of the first pixels P1, light that has passed through the entire area of the organic photoelectric film 310 is incident upon the entire area of the second imaging element 32. And, during the photographic operation, the second imaging element 32 generates photoelectrically converted signals corresponding to the light that is incident upon the entire areas of the second pixels P2. In other words, the second imaging element 32 generates an image of the photographic subject that has been projected by the photographic optical system 10. And the second generation unit 114 generates image data by performing image processing upon these photoelectrically converted signals that have thus been generated. In other words, on the basis of the signals from the second imaging element 32, the second generation unit 114 generates image data having a single imaging plane in the photographic optical system 10. And the second generation unit 114 stores this image data that has been generated from the photoelectrically converted signals from the second imaging element 32 upon a storage medium such as the memory card 117 or the like.

Figure 7:
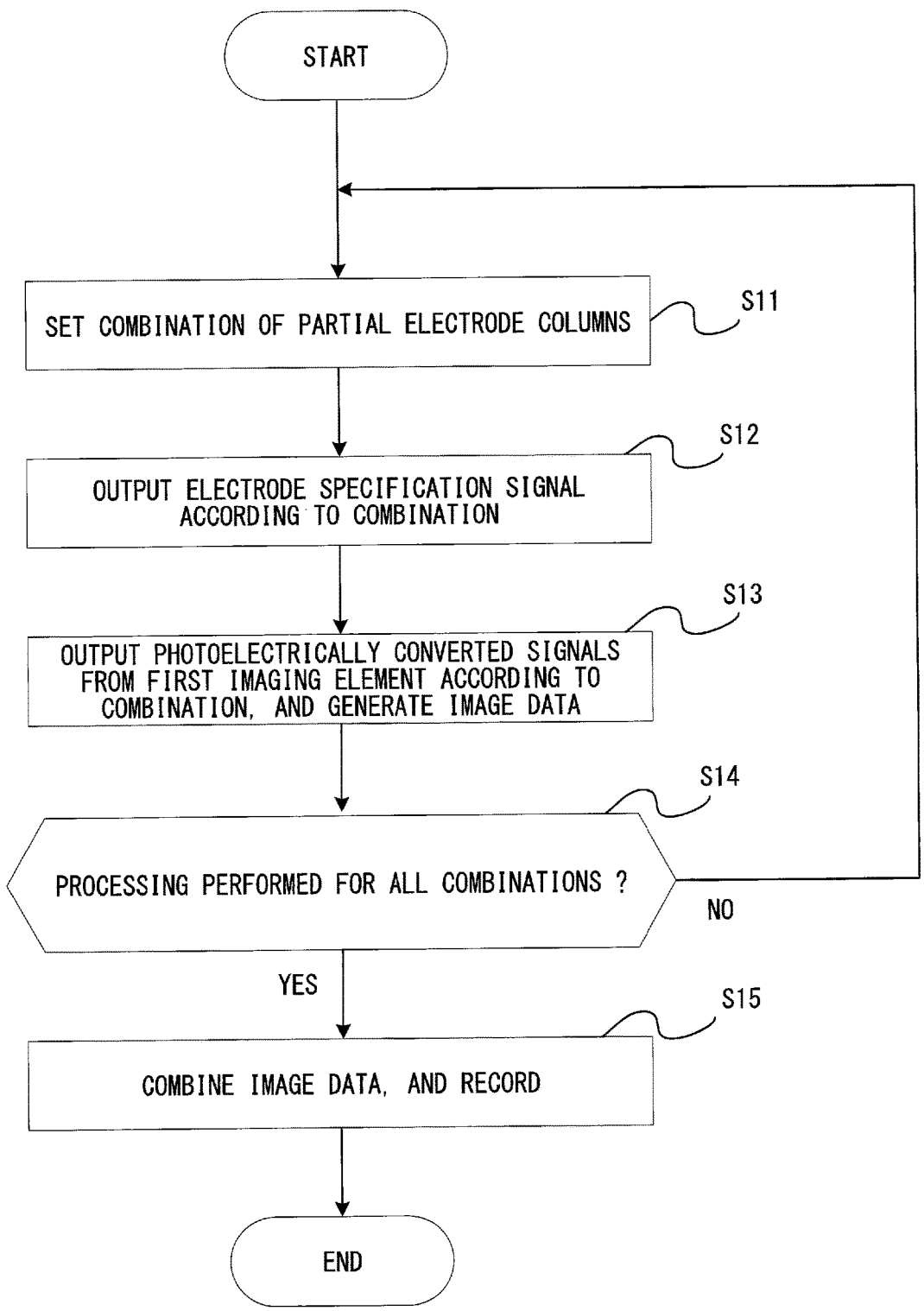
FIG. 7 is a flow chart for explaining the flow of photographic processing.

It should be understood that the first generation unit 113 is not to be considered as being limited to generating image data by employing the photoelectrically converted signals from the first imaging element 31; it would also be acceptable for it to generate image data by employing the photoelectrically converted signals from the first imaging element 31 and from the second imaging element 32. In this case, the first generation unit 113 generates image data by employing the photoelectrically converted signals from the first imaging element 31, in a similar manner to that described above. Furthermore, the first generation unit 113 generates new image data by subtracting the image data generated by employing the photoelectrically converted signals from the first imaging element 31, from the image data generated by the second generation unit 114 by employing the photoelectrically converted signals from the second imaging unit 32. As a result, for example, if for example image data corresponding to the pattern information shown in FIG. 6(*b*) has been generated by employing the photoelectrically converted signals from the first imaging element 31, then it is possible to generate image data corresponding to a reverse pattern code aperture in which the light interception portions 501 and the transparent portions 502 have been interchanged Processing for acquiring image data for a plurality of different imaging planes using the photoelectrically converted signals from the first imaging element 31 will now be explained with reference to the flow chart shown in FIG. 7. The processing shown in the flow chart of FIG. 7 is included in the control program executed by the control section 11. The processing of FIG. 7 starts when a predetermined focus detection operation (for example operation for full press of a release button, or the like) is performed by the photographer.

In step S11 the pattern information is read out and a combination of a first electrode 311 and a second electrode 312 is set, and then the flow of control proceeds to step S12. If image-capturing is to be performed for refocusing, a plurality of combinations are set. In step S12, electrode specification signals are outputted to the first electrodes 311 and the second electrodes 312 according to the combination that has been set, and then the flow of control proceeds to step S13. In step S13, the photoelectrically converted signals from the first imaging element 31 for the combination of the first electrodes 311 and the second electrodes 312 that were specified are read out, and image data is generated using these photoelectrically converted signals that have been read out, and then the flow of control proceeds to step S14. In step S14, if image-capturing is to be performed for refocusing, then it is determined whether or not processing has been performed for all of the combinations of the first electrodes 311 and second electrodes 312. If all of the combinations have been processed, then an affirmative decision is reached in step S14 and the flow of control proceed to step S15. But if all of the combinations have not yet been processed, then a negative decision is reached in step S14 and the flow of control returns to step S11. It should be understood that it may be arranged for the user to be capable of setting the number of items of image data required for refocusing, and image data may not be generated for all of the pattern information. In step S15, the image data that has been generated is synthesized and is recorded on a recording medium (not shown in the figures), and then processing terminates.

According to the first embodiment described above, the following advantageous operational effects are obtained.

(1) In the first imaging element 31, a plurality of light reception units 400 are disposed for each of the micro-lenses ML. And each of the light reception units 400 includes the organic photoelectric film 310 that photoelectrically converts a received light flux, the first electrode 311 that is provided upon one surface of the organic photoelectric film 310, and the second electrode 312 that is provided on the other side of the organic photoelectric film 310. The plurality of first electrodes 311 are provided for each micro-lens ML and are arranged to extend along the column direction, and the plurality of second electrodes 312 are provided for each micro-lens ML and are arranged to extend along the row direction. Accordingly it becomes unnecessary to insert or to extract a coded aperture for obtaining a photoelectrically converted signal from a partial region of the first imaging element 31 in order to generate image data for an image upon a predetermined imaging plane of the photographic optical system 10, and therefore the convenience can be enhanced.

(2) The readout control unit 111 sets a combination for the first imaging element 31 consisting of at least a single first electrode 311 from among the plurality of first electrodes 311 and at least a single second electrode 312 from among the plurality of second electrodes 312, and causes photoelectrically converted signals to be outputted from the light reception units 400 included in the region that corresponds to the combination. And, each time one of a plurality of different combinations are set, the readout control unit 111 causes photoelectrically converted signals to be outputted from the light reception units 400 included in the regions that correspond to that combination, and the first generation unit 113 generates image data for each of a plurality of different imaging planes of the photographic optical system 10 by employing the photoelectrically converted signals that have been read out for each combination. Accordingly, by setting a plurality of combinations of first electrodes 311 and second electrodes 312 and generating image data for each of the combinations that have been set, it is possible to generate image data for each of a plurality of different imaging planes of the photographic optical system 10 in a similar manner to the case when coded apertures of a plurality of types are repeatedly inserted or extracted, so that the convenience is improved. Furthermore, since the time required when repeating the insertion and the extraction of such coded apertures of a plurality of types of is reduced, accordingly, in particular in the case of photographing a photographic subject that is moving, it is possible to prevent generation of image data in which position of the photographic subject and so on are greatly shifted.

(3) The second imaging elements 32 that are provided for each of the micro-lenses ML and that receive the light fluxes that have passed through the first image imaging elements 31 output photoelectrically converted signals, and the second generation unit 114 generates image data by employing these photoelectrically converted signals from the second imaging element 32. Accordingly it is possible to perform normal photographic operation by employing the second imaging element 32, while generating image data for images on each of various different imaging planes of the photographic optical system by employing the first imaging element 31. Furthermore, the first generation unit 113 is able to generate new image data by subtracting the image data that has been generated by employing the photoelectrically converted signals from the first imaging element 31 from the image data generated by the second generation unit 114. By doing this, during photography of one frame, it is possible to generate image data for each of two different imaging planes, and accordingly this makes a contribution to shortening the time period required for photography.

(4) The plurality of pixels P1 include the plurality of first electrodes 311 that are provided on the one surfaces of the light reception units 400 that receive incident light, and the plurality of second electrodes 312 that are provided upon the other surfaces of the light reception units 400. The readout control unit 111 outputs the signal generated by receipt of incident light by the light reception units 400 that are sandwiched between the first electrodes 311 to which voltage is applied and the second electrodes 312. Due to the voltages applied between the first electrodes 311 and the second electrodes 312 being controlled by the readout control unit 111, the first imaging element 31 is enabled to generate a signal for creating image data for some desired imaging plane. Because of this, it becomes unnecessary to insert or extract any coded aperture for the purpose of generating image data for refocusing processing, so that it is possible to enhance the level of convenience.

(5) The digital camera 1 comprises the first imaging element 31, the second imaging element 32 that receives light transmitted through the first imaging element 31, and the image generation unit 115 that generates image data for a plurality of different imaging planes on the basis of the signal from the first imaging element 31. Moreover, the image generation unit 115 also generates image data having a single imaging plane on the basis of the signal from the second imaging element 32. Due to this, it is possible to perform normal photographic operation by employing the second imaging element, while generating image data for different imaging planes by employing the first imaging element 31 so as to enable refocusing processing.

Embodiment #2

A second embodiment of the present invention will now be explained with reference to the drawings. In the following explanation, the same reference symbols will be appended to structural elements that are the same as corresponding elements of the first embodiment, and the explanation will focus upon the features of difference. Features that are not particularly explained are the same as in the first embodiment. In this second embodiment, it is arranged for it to be possible for the focus detection processing to be performed by employing the photoelectrically converted signals read out from the first imaging element 31 and also from the second imaging element 32.

Figure 8:
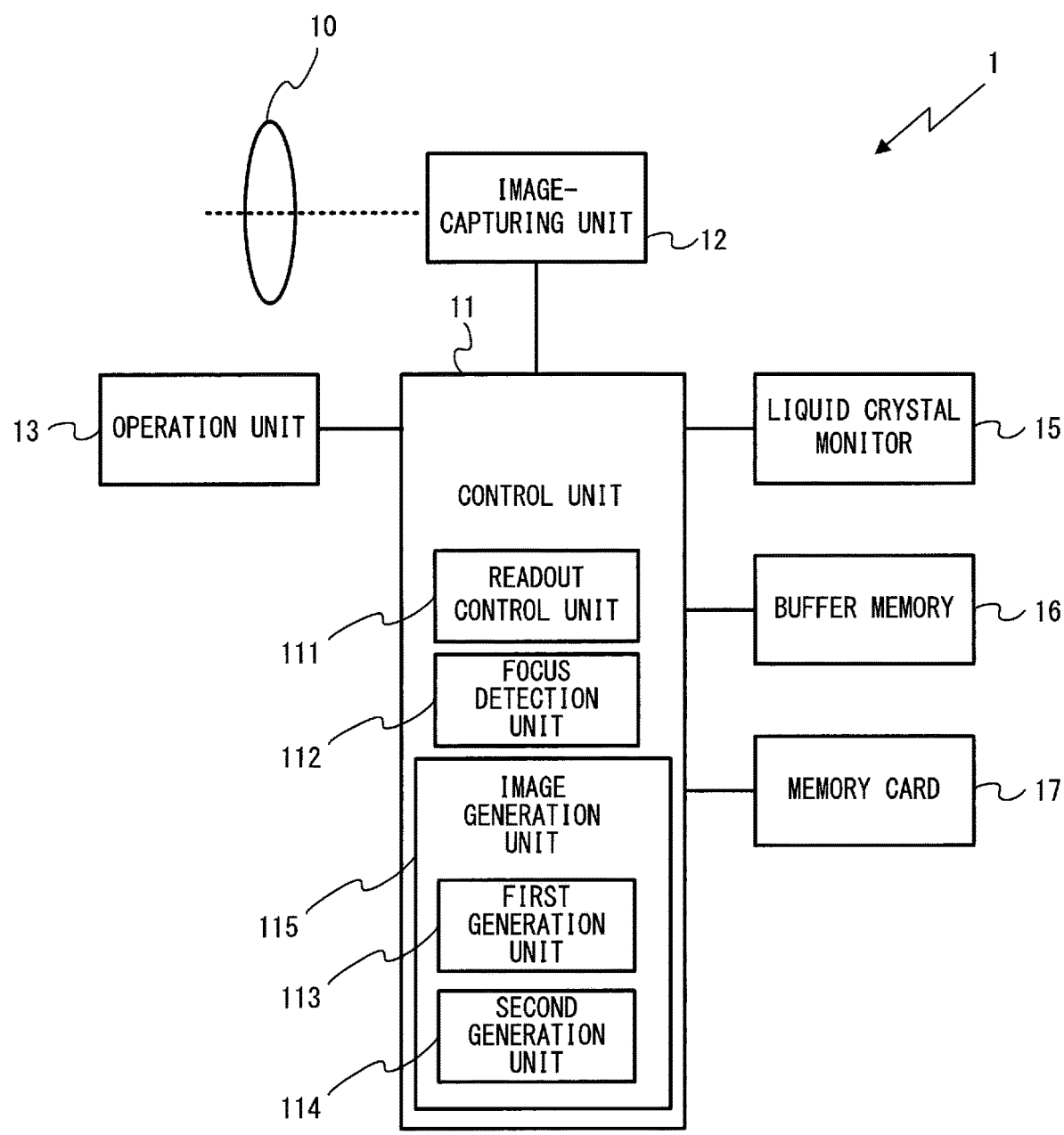
FIG. 8 is a block diagram for explanation of an example of the structure of a digital camera according to a second embodiment.

As shown in the block diagram of FIG. 8, the control section 11 of the digital camera 1 provides the function of a focus detection unit 112. On the basis of the photoelectrically converted signals read out from the first imaging element 31 and the second imaging element 32, this focus detection unit 112 performs focus detection processing according to a per se known split pupil difference method, and thereby adjusts the state of focusing of the photographic optical system.

In the following, the processing in this second embodiment when performing focus detection processing will be explained. From among the plurality of first electrodes 311 and the plurality of second electrodes 312 of the first imaging element 31, the readout control unit 111 of the control section 11 sets combinations of the first electrodes 311 and the second electrodes 312 that are to be specified.

Figure 9:
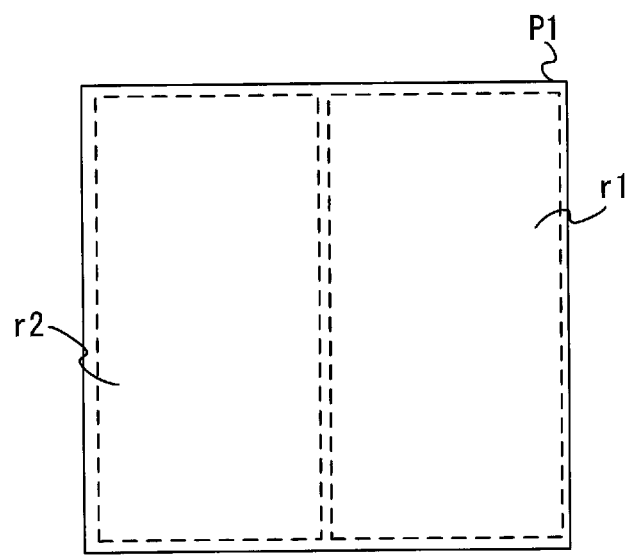
FIG. 9($a$) is a figure schematically showing a partial region that is selected upon a first imaging element when focus detection processing is performed, and FIG. 9($b$) is a figure schematically showing a combination of first electrodes and second electrodes.
Figure 9:
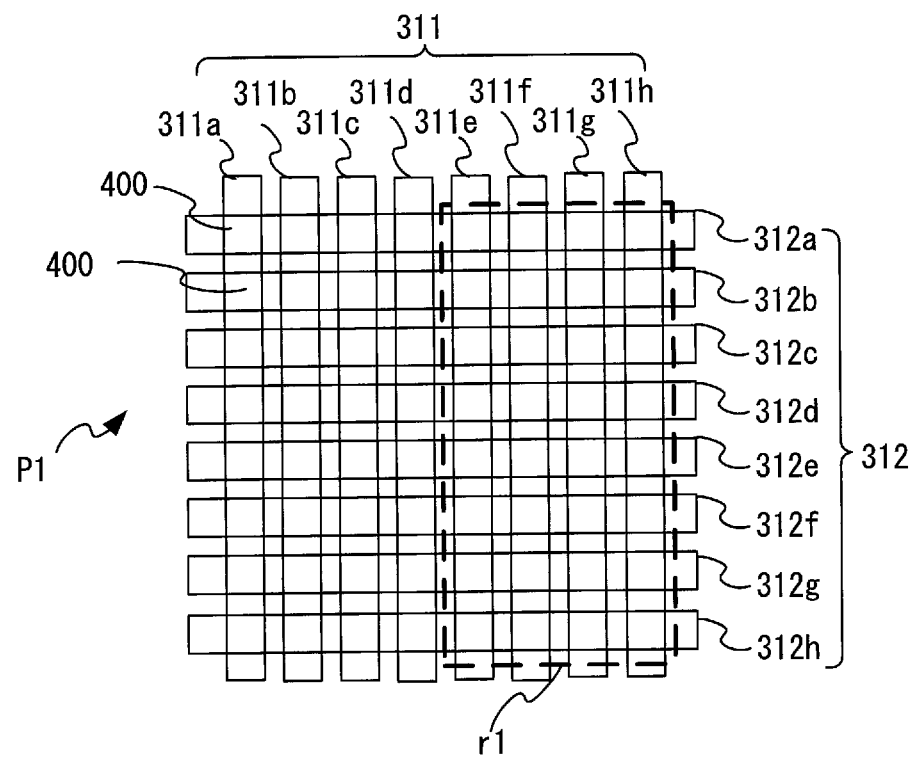

FIG. 9 schematically shows, for the first pixels P1 of the first imaging element 31, when focus detection processing is performed, regions from which photoelectrically converted signals are outputted and a combination of first electrodes 311 and second electrodes 312.

FIG. 9(a) is a figure schematically showing a partial region r1 of a first pixel P1 on the first imaging element 31 from which photoelectrically converted signals are outputted. As shown in this figure, for example, the readout control unit 111 sets a combination of the first electrodes 311 and the second electrode 312 for defining the right side partial half region of the first pixels P1 of the first imaging element 31 as the partial region r1. In this case, as shown in FIG. 9(b), the readout control unit 111 specifies the first electrodes 311e through 311h and the second electrodes 312a through 312h. Accordingly, photoelectrically converted signals are outputted from the light reception units 400 included in the region defined by this combination of the first electrodes 311e through 311h and the second electrodes 312a through 312h of the first imaging element 31, in other words from the light reception units 400 included in the partial region r1. To put it in another manner, photoelectrically converted signals are outputted corresponding to the light incident upon the right side half partial region r1 of each of the first pixels P1 of the first imaging element 31. And the first generation unit 113 generates first image data from the photoelectrically converted signals described above that are outputted from the first imaging element 31.

The readout control unit 111 outputs the photoelectrically converted signal from the second imaging element 32. In this case, the light that has passed through the entire area of the first pixel P1 is incident upon the entire area of the second pixel P2 of the second imaging element 32. Due to this, for the second imaging element 32, photoelectrically converted signals are outputted for the entire area of each of the second pixels P2. And the second generation unit 114 generates second image data by employing the photoelectrically converted signals from all of the second pixels P2 of the second imaging element 32. The focus detection unit 112 of the control section 11 generates image data according to the light that is incident upon the left side half region of each of the pixels P by using the first image data generated by the first generation unit 113 and also the second image data generated by the second generation unit 114. In this case, for example, the focus detection unit 112 subtracts the first image data based upon the photoelectrically converted signals outputted from the first imaging element 31 from the second image data based upon the photoelectrically converted signals outputted from the second imaging element 32. In other words, the focus detection unit 112 generates third image data corresponding to the left side half region of the first pixel P1, in other words corresponding to the region r2 in FIG. 9(a), by subtracting the first image data corresponding to the right side half region of the first pixel P1 from the second image data corresponding to the entire area of the second pixel P2.

Since, as described above, the first imaging element 31 has a conjugate relationship with the photographic optical system 10 with respect to the micro-lenses ML, accordingly the first image data and the third image data correspond to light fluxes that have passed through different exit pupils. The focus detection unit 112 performs focus detection processing by the split pupil phase difference method by employing the first image data as first focus detection data, and by employing the third image data that has been generated as described above as second focus detection data, and thereby calculates the focus adjustment state of the photographic optical system 10. It should be understood that, since focus detection processing according to the split pupil phase difference method is a per se known technique, accordingly detailed explanation thereof will here be omitted.

Figure 10:
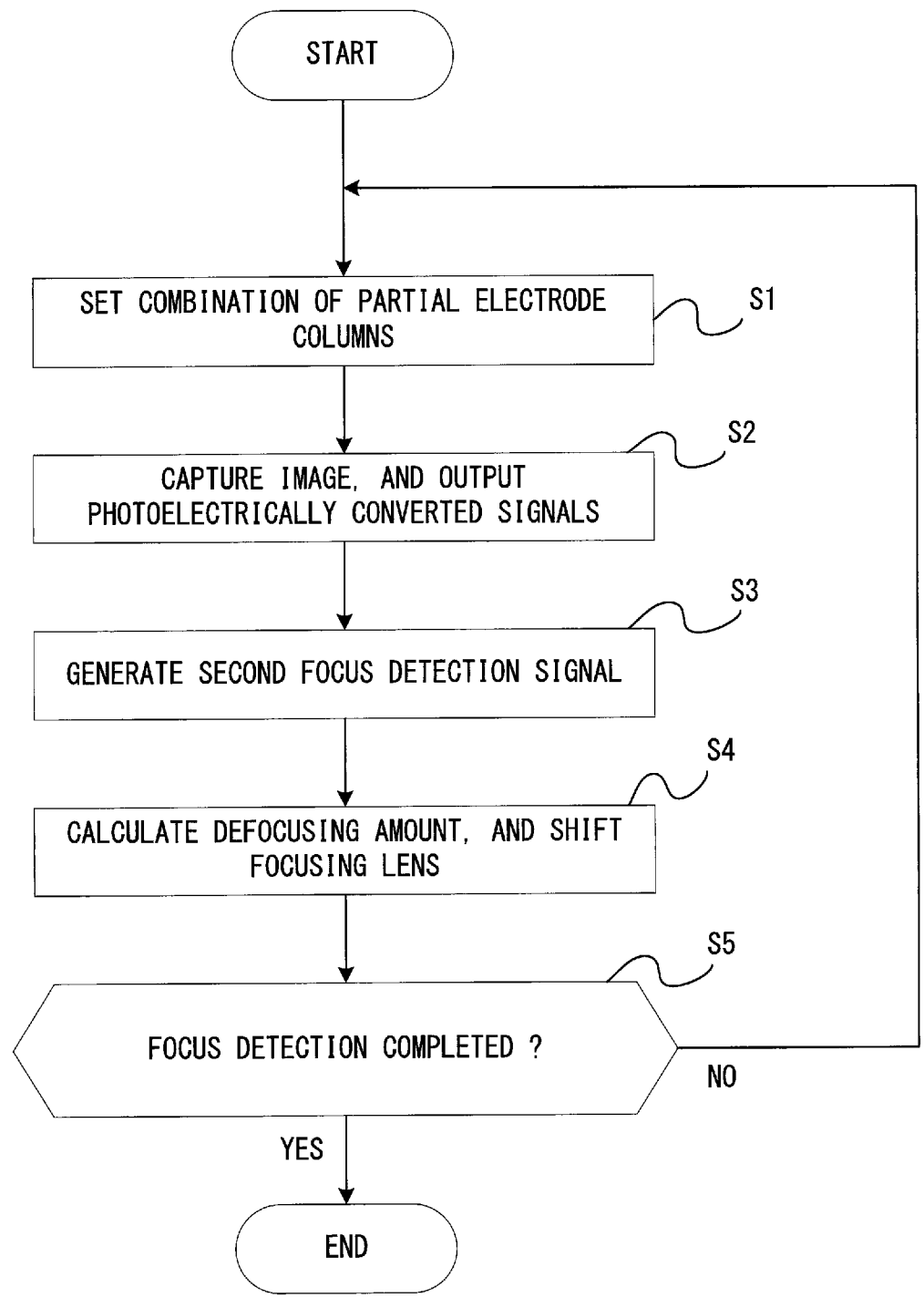
FIG. 10 is a flow chart for explanation of the flow of focus detection processing.

The focus detection processing performed by the control section 111 will now be explained with reference to the flow chart shown in FIG. 10. Each of the steps shown in the flow chart of FIG. 10 is included in a control program executed by the control section 11. When a predetermined focus detection operation (for example, half press operation of the release button or the like) is performed by the photographer, then the control section 11 starts the focus detection processing shown in FIG. 10.

In step S1, a combination of the first electrodes 311 and the second electrodes 3121 is determined in order to form the right side partial half region r1 of the first pixels P1, and then the flow of control proceeds to step S2. In step S2, an image of the photographic subject is captured by the image-capturing unit 12, in other words photoelectrically converted signals are outputted from the first imaging element 31 and the second imaging element 32, and then the flow of control proceeds to step S3. At this time, for the first imaging element 31, by outputting the electrode specification signals specified in step S1 to the first electrodes 311 and to the second electrode 312, the photoelectrically converted signals from the light reception units 400 included in the partial region r1 of the first pixels P1 of the first imaging element 31 are caused to be outputted. The first generation unit 113 generates first image data by employing the photoelectrically converted signals from the first pixels P1 of the first imaging element 31, and the second generation unit 114 generates second image data by employing the photoelectrically converted signals from the second pixels P2 of the second imaging element 32.

In step S3, third image data is generated by employing the second image data and the first image data, and then the flow of control proceeds to step S4. In step S4, the amount of defocusing is calculated according to the split pupil phase difference method by employing the first image data and the third image data, a lens drive unit (not shown in the figures) is controlled on the basis of this defocusing amount that has been calculated, and thereby the focusing lens of the photographic optical system 10 is shifted to its focusing position; and then the flow of control proceeds to step S5. In step S5, a decision is made as to whether or not a command has been issued for terminating the end of focus detection processing. If the end of focus detection processing has been commanded, then an affirmative decision is reached in step S15 and the control section 11 terminates the focus detection processing. But if no command has been issued for termination of the focus detection processing, then a negative decision is reached in step S15 and the control section 11 returns the flow of control to step S1.

It should be understood that, although in the above description the right side of each of the first pixels P1 of the first imaging element 31 was set as the partial region r1 this is not to be considered as being limitative. It will be acceptable, for example, for the position of the partial region r1 to be at the left side of each of the first pixels P1 of the first imaging element 31, or for the partial regions to be the upper portions of the pixels or at the lower portions thereof.

It should be understood that, in this second embodiment as well, during photographic operation, by specifying the first electrodes 311 and the second electrodes 312 in a similar manner to the case in the first embodiment, image data is generated for images upon each of several different imaging planes of the photographic optical system.

According to the second embodiment described above, in addition to the advantageous operational effects obtained with the first embodiment, also the following advantageous operational effect is obtained.

The focus detection unit 112 detects the focus adjustment state of the photographic optical system 10 by employing the third image data that has been generated by subtracting the first image data that is based upon the photoelectrically converted signal from the first imaging element 31 that has been read out according to the combination set by the readout control unit 111 from the second image data that is based upon the photoelectrically converted signal from the second imaging element 32, and the first image data. Accordingly it is possible to obtain the two sets of focus detection data that enable focus adjustment by the split pupil phase difference method, without providing any pixels for focus detection.

Variations such as described below also come within the range of the present invention, and one or a plurality of such variant embodiments may also be combined with the embodiments described above.

Figure 11:
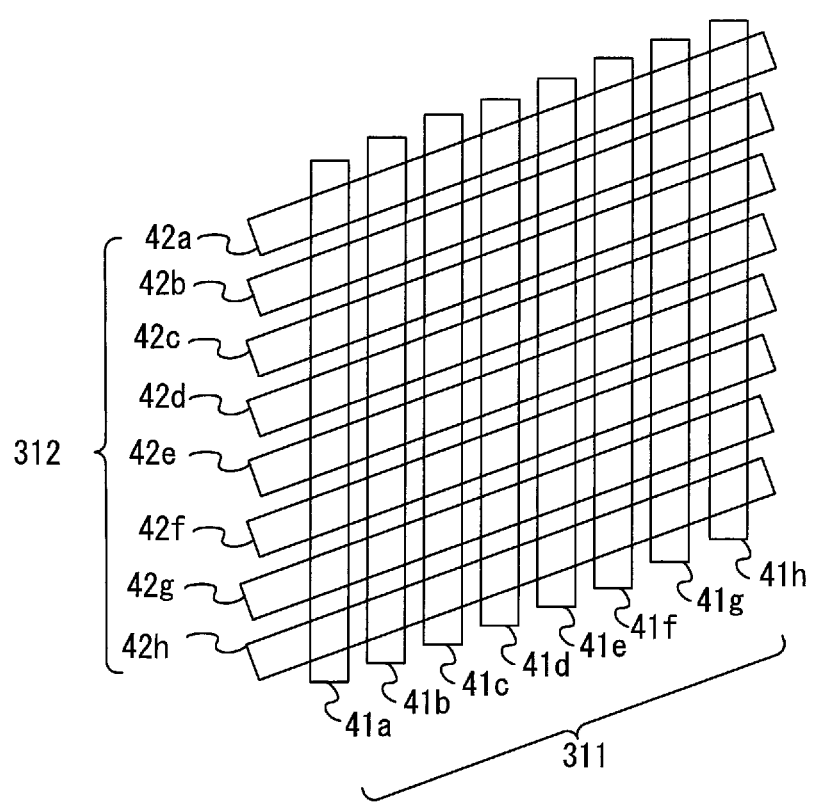
FIG. 11 is a figure schematically showing an example of arrangement of first electrodes and second electrodes in a variant embodiment.

(1) The first electrodes 311 and the second electrodes 312 are not to be considered as being limited by those provided in the embodiments described above that are orthogonal to one another. For example, as shown in FIG. 11, it would also be acceptable for the second electrodes 312 to intersect the first electrodes 311, which extend along the column direction and are arranged along the row direction, at a slanting angle.

(2) It would also be acceptable for the image-capturing unit 12 of the digital camera 1 only to have the first imaging element 31, instead of having both the first imaging element 31 and the second imaging element 32. In this case as well, the readout control unit 111 controls combinations of the first electrodes 311 and the second electrodes 312, so that it is possible for light that is incident upon the light reception units 400 included in a partial region of the first pixels P1 of the first imaging element 31 to be photoelectrically converted, and for the resulting photoelectrically converted signal to be outputted. For example, if focus detection processing is to be performed, as shown in FIGS. 9(a) and 9(b), then the readout control unit 111 specifies first electrodes 311 and second electrodes 312 so that photoelectrically converted signals are outputted from the right side half regions r1 of the first pixels P1 of the first imaging element 31. And the first generation unit 113 generates first image data from these photoelectrically converted signals. Then, when acquiring the image of a subsequent frame, the readout control unit 111 specifies first electrodes 311 and second electrodes 312 so that photoelectrically converted signals are outputted from the left side half regions r1 of the first pixels P1 of the first imaging element 31. And the first generation unit 113 generates the second image data by employing these photoelectrically converted signals. And then, using this first image data and this second image data, the focus detection unit 112 is able to perform focus detection processing by the split pupil phase difference method, and is able to calculate a defocusing amount giving the focus adjustment state of the photographic optical system 10.

Also, if distance information is to be obtained for refocusing, by controlling the combination of the first electrodes 311 and the second electrodes 312, the readout control unit 111 is able to focus point images that are incident from different positions in the depth direction of the photographic subject space into images upon the light reception surface of the first imaging element 31.

(3) It would also be possible to apply the image-capturing device explained with reference to the first or second embodiment described above or to a variant embodiment to a camera that is mounted to a smart phone or to a tablet, or to an onboard camera that is mounted to a PC, or to an electronic camera that is mounted to an unmanned aircraft (such as a drone, a radio-controlled flying machine, or the like), etc.

The present invention is not to be considered as being limited to the embodiments described above; provided that the essential characteristics of the present invention are not lost, other embodiments that are considered to be within the range of the technical concept of the present invention are also included within the scope of the present invention.

The content of the disclosure of the following base application, upon which priority is claimed, is hereby incorporated herein by reference:

Japanese Patent Application 2731 of 2016 (filed on 8 Jan. 2016).

REFERENCE SIGNS LIST

1: digital camera
10: photographic optical system
11: control unit
12: image-capturing unit
31: first imaging element
32: second imaging element
111: readout control unit
112: focus detection unit
113: first generation unit
114: second generation unit
115: image generation unit
310: organic photoelectric layer
311: first electrode
312: second electrode
400: light reception unit

The invention claimed is:

1. An image sensor, comprising:
a photoelectric conversion unit that generates charge by photoelectrically converting light;
a first electrode that outputs the charge generated at the photoelectric conversion unit, the first electrode being provided along a first direction upon one surface of the photoelectric conversion unit, and the one surface intersecting a direction along which light enters, and
a second electrode that outputs the charge generated at the photoelectric conversion unit, the second electrode being provided along a second direction that intersects the first direction upon another surface of the photoelectric conversion unit, and the another surface intersecting the direction along which the light enters, and
an output unit that outputs a signal based upon the charge generated by the photoelectric conversion unit.

2. The image sensor according to claim 1, comprising:
a plurality of photoelectric conversion units, wherein:
the first electrode is provided for the plurality of photoelectric conversion units, along the first direction; and the second electrode is provided for the plurality of photoelectric conversion units, along the second direction.

3. An image-capturing device comprising:

the image sensor according to claim 2; and an image generation unit that generates a plurality of image data based upon a signal outputted from the output unit of the image sensor.

4. The image-capturing device according to claim 3, further comprising:

a setting unit that sets different combinations each consisting of at least a single first electrode from among the plurality of first electrodes and at least a single second electrode from among the plurality of second electrodes, and wherein;

the output unit outputs a signal based upon the charge generated by the photoelectric conversion unit, for each of different combinations set by the setting unit; and the image generation unit generates the plurality of image data based upon a signal outputted from the output unit.

5. The image-capturing device according to claim 4, wherein:

the setting unit sets combinations by performing specification or non-specification of each of the plurality of second electrodes, each time voltages are applied to each of the plurality of first electrodes; and the output unit outputs a signal based upon the charge generated by the photoelectric conversion unit that is provided between the first electrode to which a voltage has been applied and the second electrode that has been specified, each time a voltage is applied to one of the first electrodes.

6. The image-capturing device according to claim 3, further comprising a first light reception unit that comprises the photoelectric conversion unit, the first electrode and the second electrode; and a second light reception unit that receives light that has passed through the first light reception unit;

wherein the image generation unit generates image data based upon a signal from the second light reception unit.

7. The image-capturing device according to claim 6, comprising a focus detection unit that performs a focus detection for an optical system by using image data generated based upon the signal from the first light reception unit and image data generated based upon the signal from the second light reception unit.

8. The image-capturing device according to claim 3, wherein the image generation unit generates the image data for each of different image planes of an optical system.

9. The image sensor according to claim 1, wherein the photoelectric conversion unit is provided, along a direction intersecting the direction along which light enters, between the first electrode and the second electrode.

10. The image sensor according to claim 1, further comprising:

a plurality of photoelectric conversion units disposed along the first direction and the second direction, wherein:

the first electrode is provided for the plurality of photoelectric conversion units, along the first direction; and the second electrode is provided for the plurality of photoelectric conversion units, along the second direction.

* * * * *